United States Patent [19]

Qureshi

[11] 4,439,864
[45] Mar. 27, 1984

[54] MODEM CIRCUITRY

[75] Inventor: Shahid U. H. Qureshi, Natick, Mass.

[73] Assignee: Codex Corporation, Mansfield, Mass.

[21] Appl. No.: 136,503

[22] Filed: Apr. 3, 1980

[51] Int. Cl.$^3$ .............................................. H03G 3/20
[52] U.S. Cl. ...................................... 375/98; 364/150; 381/108
[58] Field of Search ............... 375/8, 76, 98; 455/234, 455/235, 239, 240, 241, 245, 247, 250, 251; 364/150, 151, 183, 606, 571, 480; 179/1 VL; 381/107, 108, 110

[56] References Cited

U.S. PATENT DOCUMENTS

| | | | |
|---|---|---|---|
| 3,562,504 | 2/1971 | Harris | 375/98 |
| 3,978,407 | 8/1976 | Forney, Jr. et al. | 375/13 |
| 4,004,226 | 7/1975 | Quresh | 375/13 |
| 4,085,449 | 11/1976 | Wash | 375/8 |
| 4,222,118 | 9/1980 | Dickinson et al. | 455/247 |
| 4,270,177 | 5/1981 | Endoh | 364/606 |
| 4,276,604 | 6/1981 | Kitamura et al. | 364/480 |
| 4,297,527 | 10/1981 | Pate | 179/1 VL |

OTHER PUBLICATIONS

Digital Automatic Gain Control by NASA's Jet Propulsion Laboratory, Pasadena, CA, NASA Tech. Brief, Fall 1979, vol. 4, No. 3.

Primary Examiner—Robert L. Griffin
Assistant Examiner—Stephen Chin

[57] ABSTRACT

Automatic gain control circuitry in a modem receiver, featuring a digitally controlled gain element for imposing on the received modulated carrier signal a gain corresponding to gain control signals g received from a microprocessor, an analog-to-digital converter to provide the microprocessor with digital samples of the received modulated pg,2 carrier signal, and a gain control in the microprocessor for comparing an estimate of the average level of the samples with a desired level, and generating the control signals g based on the result of the comparison.

10 Claims, 7 Drawing Figures

MODEM CIRCUITRY

BACKGROUND OF THE INVENTION

This invention relates to modem apparatus in which a modulated carrier signal represents digital bits.

Modem receivers typically include automatic gain control circuitry, as well as circuitry for detecting the presence or loss of carrier on the line.

Recently, efforts have been made to use programmable microprocessing circuitry to carry out certain modem functions, e.g., as described in Walsh et al. U.S. Pat. No. 4,085,449.

Walsh uses analog circuitry for automatic gain control.

Forney, Jr. et al., U.S. Pat. No. 3,978,407 and Qureshi et al., U.S. Pat. No. 4,004,226, show other examples of gain control and carrier detect circuitry.

SUMMARY OF THE INVENTION

In general, the invention provides improved automatic gain control circuitry in a modem receiver, featuring a digitally controlled gain element connected to microprocessor circuitry to receive therefrom gain control signals g, analog to digital converter circuitry connected to the microprocessor circuitry to provide it with digital samples of a received modulated carrier signal, and gain control means in the microprocessor circuitry for storing and executing program instructions to estimate a gain control average level of the samples, comparing the average with the desired level to compute a value representative of the relationship between the average and desired levels, and generating the control signals g based upon the relationship.

In preferred embodiments, the microprocessor circuitry has means for storing a gain limit value and inhibiting the transfer to the gain element of gain control signals beyond the limit value; the microprocessor circuitry has carrier detect means for storing a gain value corresponding to the current gain provided by the element, computing the carrier detect average level of the samples, and using the stored gain and carrier detect average to raise a carrier detect signal when the carrier detect average exceeds a carrier detect threshold; the carrier detect average differs from the gain control average; the carrier detect means includes means for limiting the samples prior to computation of the carrier detect average; and the microprocessor circuitry has carrier loss means for storing a gain value corresponding to the current gain provided by the element, computing the carrier loss average level of the samples, and using the stored gain and carrier loss average to raise a carrier loss signal when the carrier loss average falls below a carrier loss threshold.

Other advantages and features will appear from the following description of the preferred embodiment, and in the claims.

DESCRIPTION OF THE PREFERRED EMBODIMENT

We first briefly describe the drawings.

Drawings

STRUCTURE

Figure 1:
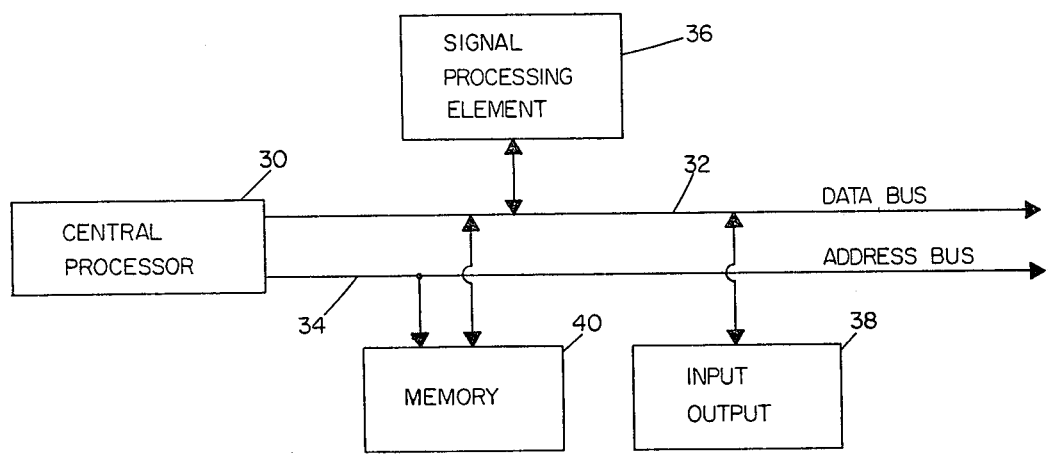
FIG. 1 is a general block diagram of a receiver embodying the invention.

Referring to FIG. 1, the receiver has a central microprocessor (MPU) 30 (the Motorola 68B00 general purpose microprocessor chip), connected to data bus 32 and address bus 35. Signal processor element (SPE) 36 and input/output circuitry 38 are also connected to bus 32. MPU memory 40 is connected to both buses.

Figure 2:
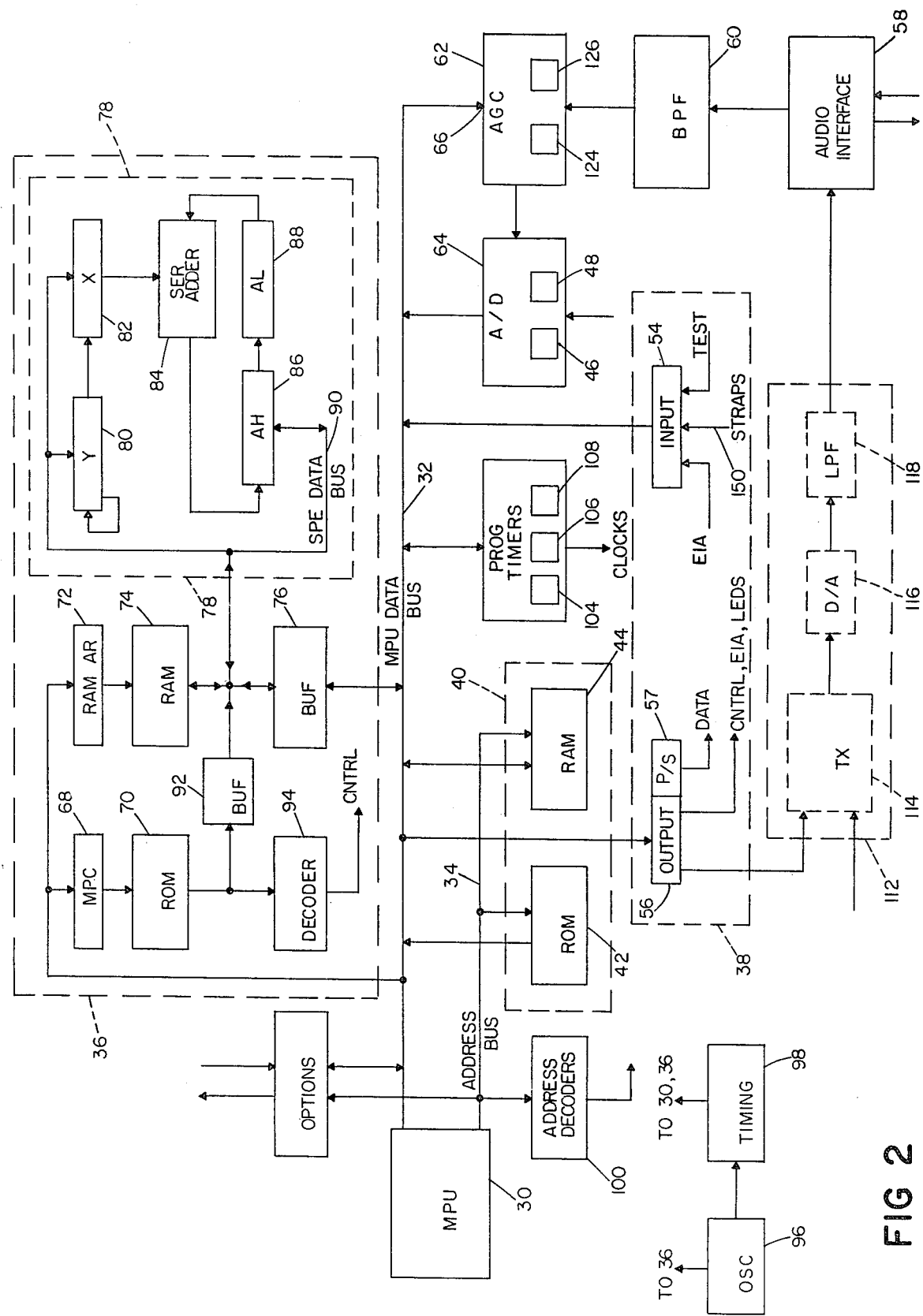
FIG. 2 is a more detailed block diagram of the receiver.

Referring now to FIG. 2, MPU 30 has a 4K×8 bit ROM program memory 42, from which MPU 30 executes instructions, and a 256×8 bit RAM data memory 44. MPU 30 interfaces with conventional data terminal equipment and the modem front panel (straps, test switches, indicators, and the like), through input and output registers 54 and 56.

Audio interface 58, band pass filter 60, AGC element 62, and A/D converter 64 are arranged to initially process received signals and put them on data bus 32. Bus 32 also has a control connection 66 directly to element 62.

Converter 64 has a sample-and-hold circuit 46 clocked at 7200 samples/sec., and an 8 bit A/D element 48.

AGC element 62 consists of an 8 bit latch 124 connected to multiplying D/A converter 126. Latch 124 is arranged to receive a coarse gain control signal g from MPU 30, once during each symbol interval and to pass g to multiplying D/A converter 126, thus producing an output voltage $v_{out}$ proportional to the product of g and input voltage $v_{in}$.

SPE 36 is an independent, programmable digital processor which is loosely coupled to, and executes tasks under the control of, MPU 30. Three elements of SPE 36 are connected to data bus 32: microprogram counter (MPC) 68, which can be loaded by MPU 30 and determines the next instruction address in 1K×8 bit ROM program memory 70 for SPE 36; random access memory address register (RAM AR) 72, which can also be loaded by MPU 30 and points to the operand in 256×8 bit data memory 74; and 8 bit read/write buffer 76, through which MPU 30 and SPE 36 can exchange data.

Arithmetic unit 78, in SPE 36, has two 8 bit registers, Y register 80 and X register 82; a serial adder 84 which can receive, in sequence, the data stored in X register 82; and two bit 8 accumulators, "high" accumulator AH 86 which stores the 8 most significant bits of a 16 bit number and "low" accumulator AL 88 which stores the remaining 8 bits. Y register 80, X register 82, and AH 86 are all connected through SPE data bus 90 to SPE data memory 74, read/write buffer 76, and intermediate buffer 92. Intermediate buffer 92 is in turn connected to SPE program memory 70.

SPE 36 also has an instruction register decoder 94 connected to SPE program memory 70.

Crystal oscillator 96 generates a 7.3728 MHz clock signal which is provided to SPE 36 and to frequency division circuitry 98. The output of frequency division circuitry 98 is a 1.8432 MHz clock signal which is provided to MPU 30.

Address decoders 100 connect with all components connected to MPU data bus 32.

Three programmable timers 104, 106, and 108 are provided. Timer 104 is frequency controlled by MPU 30 and generates an adjusted clock from which a sample clock signal for A/D converter 64 as well as a receiver bit-rate clock signal for the terminal are derived. Timer 106, also frequency controlled by MPU 30, generates and supplies to MPU 30 a software timing clock. Timer 108 is in communication only with MPU 30, can be reset to a predetermined time interval by MPU 30, and serves a "watchdog" function described below.

Shown in phantom in FIG. 2 are elements that participate in the modem transmitter: LSI transmitter chip (e.g., Motorola Part Number 6862) 114, D/A converter 116, and low pass filter 118, connected between output register 56 and audio interface 58.

Figure 3:
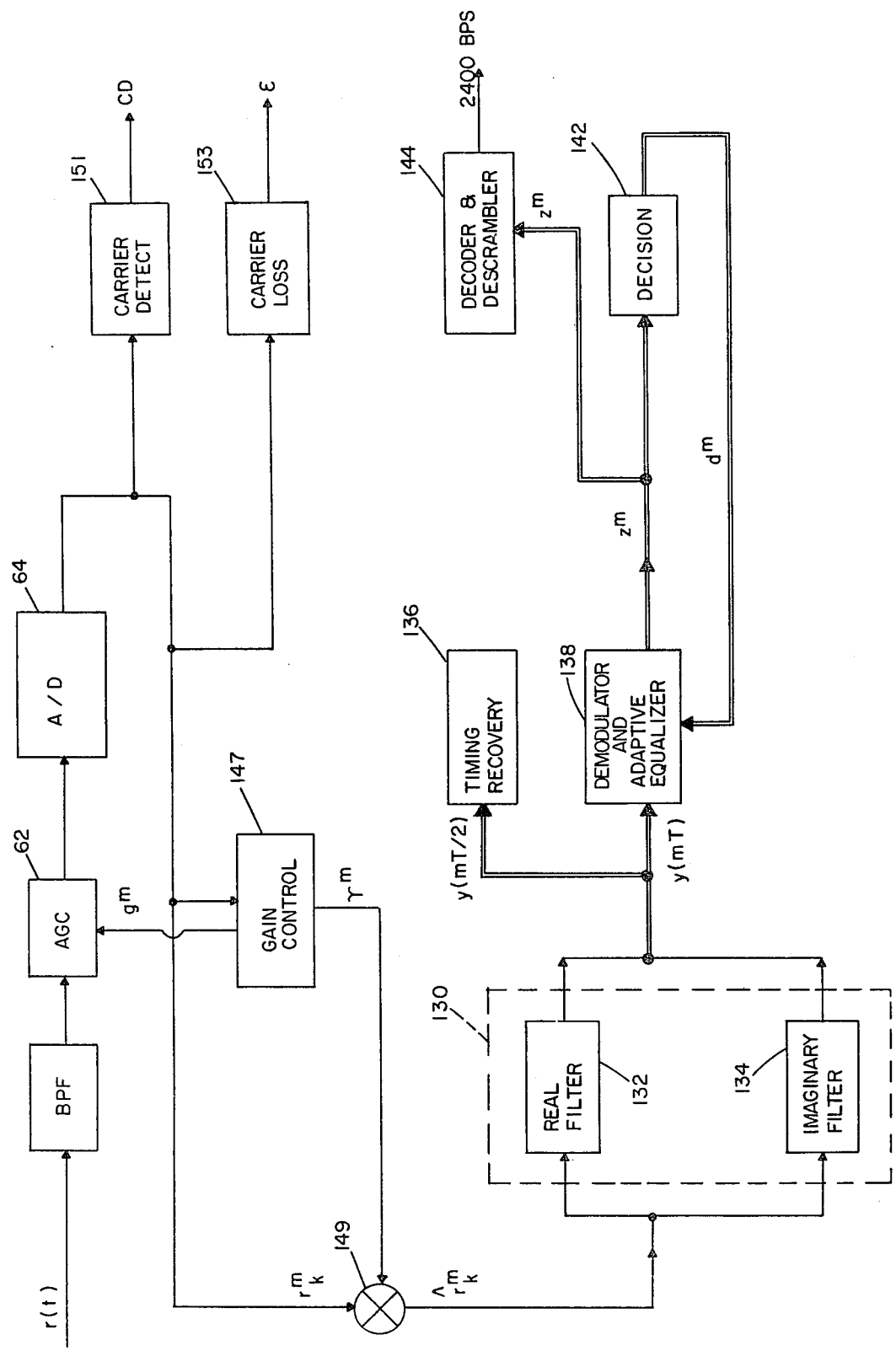
FIG. 3 is a block diagram illustrating procedures carried out by microprocessor circuitry in the receiver.

MPU 30 and SPE 36 are programmed to effect the further modem "circuits" shown generally in FIG. 3. In particular, there is effected a non-recursive, digital, phase splitting "filter" 130, with real and imaginary parts 132 and 134, which receives the output of A/D converter 64, after scaling via "multiplier" 149, and provides filtered outputs to timing recovery "circuit" 136 (at 2400 samples/sec., twice the baud rate) and to demodulation and adaptive equalization circuitry 138 (at 1200 samples/sec., the baud rate). The demodulated and equalized signal $z^m$ is passed to decision "circuit" 142, which in turn feeds "decoder/descrambler" 144 to provide a 2400 bps digital output. The output $d^m$ of decision circuit 142 is provided to circuit 138 for use in adjusting the demodulator carrier phase and frequency and updating the adaptive equalizer coefficients.

Gain control "circuit" 147, depending on the strength of signals received from converter 64, provides coarse gain control factor g to AGC element 62 and fine gain control factor $\gamma$ to multiplier 149, located within SPE 36. Carrier detect "circuit" 151 and carrier loss "circuit" 153 monitor the strength of signals from converter 64 to determine if a data transmission has begun or terminated.

Further details of how MPU 30 and SPE 36 effect these modem "circuits" and their functions appear in my copending U.S. patent application entitled "Modem Circuitry", filed on the same day as this application and hereby incorporated by reference.

OPERATION

In general, the modem, while on line, monitors the average strength of the signal samples produced by A/D converter 64 at a rate of 7,200 times per second. When a preselected threshold strength is exceeded, MPU 30 raises a carrier detect condition and sets an initial gain factor g for AGC 62. With carrier detected and gain initialized, the receiver enters a timing jam mode in which one out of six consecutive samples produced by A/D converter 64 is selected by MPU 30 for equalization and demodulation. Thereafter the tap coefficients of the equalizer are set to initial values.

The above steps completed, the receiver enters a data mode, wherein the AGC, timing rate, carrier phase, and equalizer tap coefficients are continually updated. The average signal strength is also continually computed; when it falls below a preselected carrier-off threshold, a carrier loss signal is raised, taking the modem out of data mode.

Further details of the overall operation appear in the above-identified copending application. Aspects of the operation relating to the invention claimed herein are as follows.

Once each symbol period, gain control algorithm circuit 147 of FIG. 3 outputs the two updated gain control factors; coarse gain control factor g, sent to AGC 62, determines the gain applied to the analog signal r(t) input to A/D converter 64, while fine gain control factor $\gamma$, sent to SPE 36, determines the gain applied to the $\hat{r}_k^m$ input to filter 130. The particular updated values of g and $\gamma$ are determined as follows.

MPU 30, besides buffering each incoming $r_k^m$ input from A/D converter 64, also computes and accumulates the value of $|r_k^m|/4$. Thus, at the end of any six-sample baud, MPU 30 has available, in memory, the sum:

$$\sum_{k=0}^{5} |r_k^m|/4.$$

Figure 4:
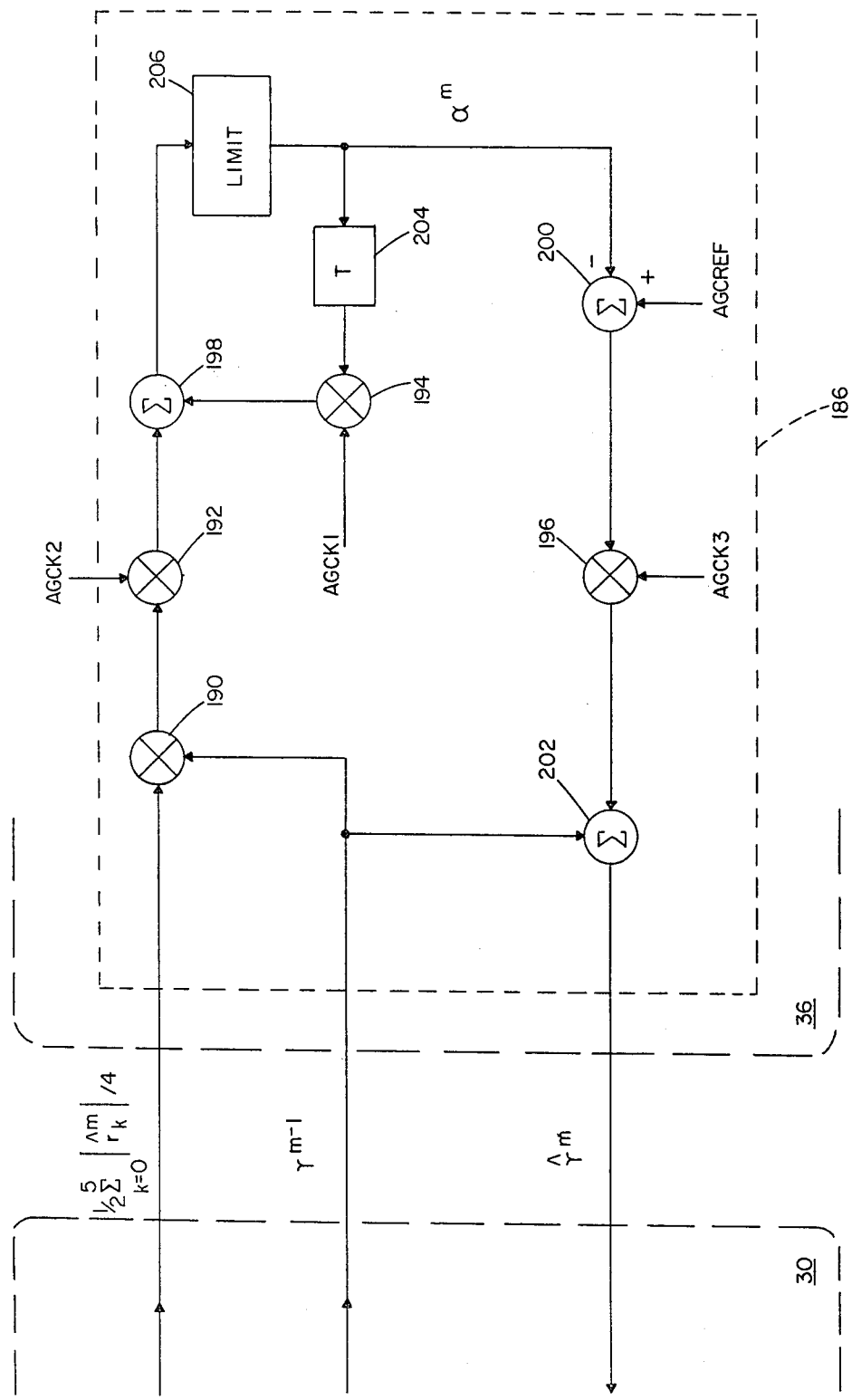
FIG. 4 is a block diagram of a procedure carried out by microprocessor circuitry in the receiver, to determine a tenative fine gain control factor.

Prior to each handshake operation, MPU 30 halves this accumulated sum by shifting one bit and sends the halved, accumulated sum, along with $\gamma^{m-1}$ (the fine gain factor applied during the previous symbol period), to SPE 36, which then computes a tentative fine gain control factor, $\hat{\gamma}^m$, according to the digital filtering operation shown in FIG. 4.

Digital filter 186 of FIG. 4 consists of: multipliers 190, 192, 194, and 196; adders 198, 200, and 202; T delay unit 204; and limiter 206. It has inputs $$\left( \frac{1}{2} \sum_{k=0}^{5} |r_k^m|/4 \right)$$

and $\gamma^{m-1}$, both sent by MPU 30, and outputs $\hat{\gamma}^m$ to MPU 30. The output of filter 186 is:

$$\gamma^m = \gamma^{m-1} + AGCK3 \, (AGCREF - \alpha^m),$$

where $$\alpha^m = AGCK1 \, \alpha^{m-1} + AGCK2 \, \gamma^{m-1} \left( \frac{1}{2} \sum_{k=0}^{5} |r_k^{m-1}|/4 \right).$$

Limiter 206 serves the function of preventing $\alpha^m$, the average signal magnitude, from overflowing. AGCK1 provides a time constant of 16 symbols. Use of a 16 symbol time constant allows both some averaging over data dependent signal strength variations and reasonably fast response to gain hits.

AGCREF is the desired value of $\alpha$, and AGCK3 is a constant which determines the speed of gain adjustment.

Figure 5:
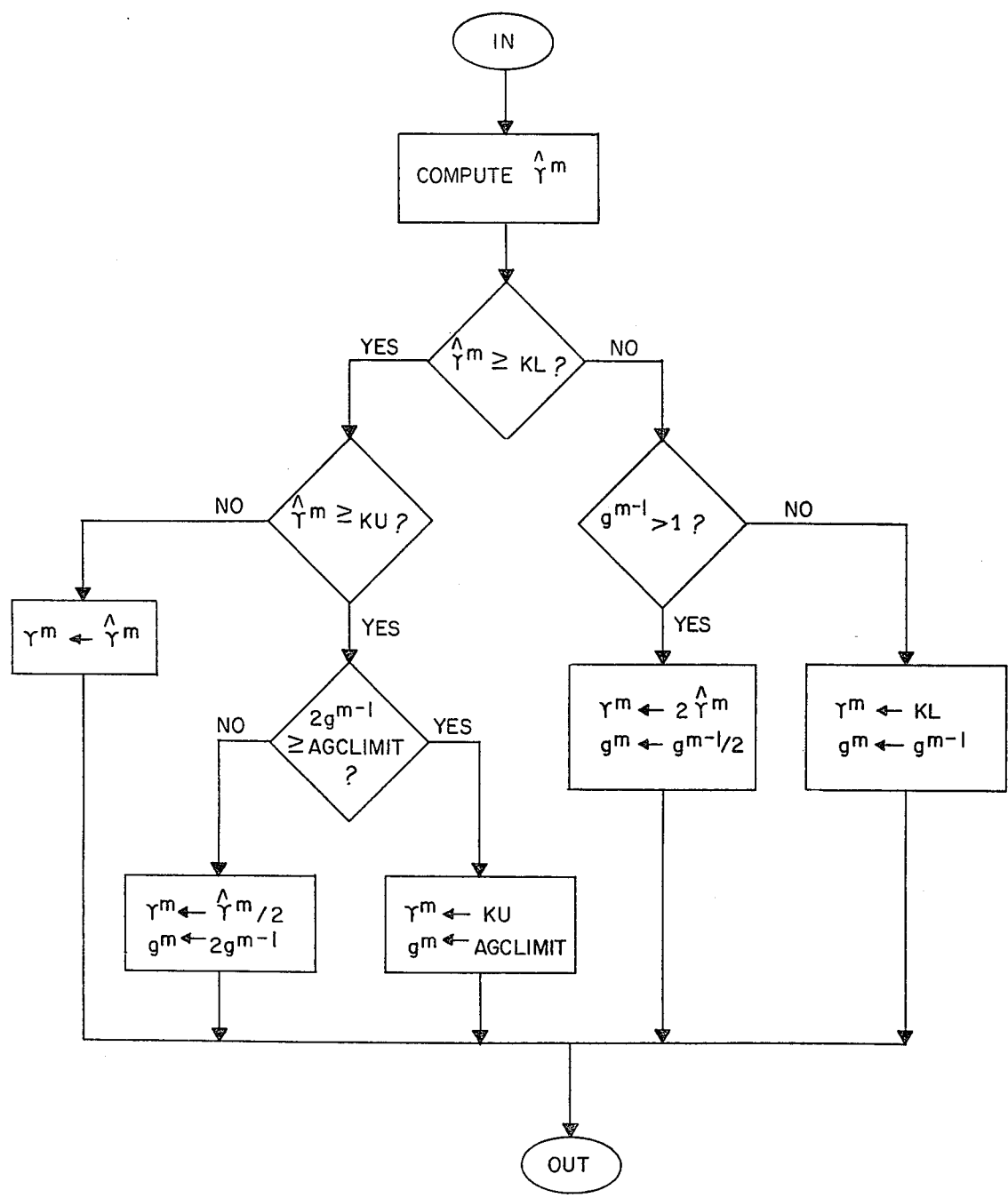
FIG. 5 is a flow chart of a procedure carried out by microprocessor circuitry in the receiver, to determine applied fine and coarse gain control factors.

The procedure which MPU 30 implements, upon receipt of $\hat{\gamma}^m$ from SPE 36, is shown by the flow chart of FIG. 5. The to-be-applied fine gain factor $\gamma^m$ is variable to limits KL and KU, where KU/KL≈2.27. Similarly, coarse gain factor g has a lower limit of 1 and an upper limit of AGCLIMIT, where AGCLIMIT is a function of the selected carrier detect threshold. In effect, MPU 30 compares tentative gain factor $\hat{\gamma}^m$ to find if it is within the limits KL and KU. If so, the desired gain can be achieved by changing $\gamma$ and holding g at its previous value. Therefore, fine gain factor $\gamma^m$ is set equal to $\hat{\gamma}^m$. Otherwise, MPU 30 either sets $g^m$ and $\gamma^m$ at their upper limits, sets $g^m$ and $\gamma^m$ at their lower limits, sets $g^m$ twice its previous value $g^{m-1}$ while setting $\gamma^m$ at half of its tentative value $\hat{\gamma}^m$, or sets $\gamma^m$ at twice its tentative value $\hat{\gamma}^m$, while setting $g^m$ at half of its previous value $g^{m-1}$.

Since KU=2.27KL the gain, g, selected by MPU 30 will be prevented from oscillating back and forth by a value of 2.

Figure 6:
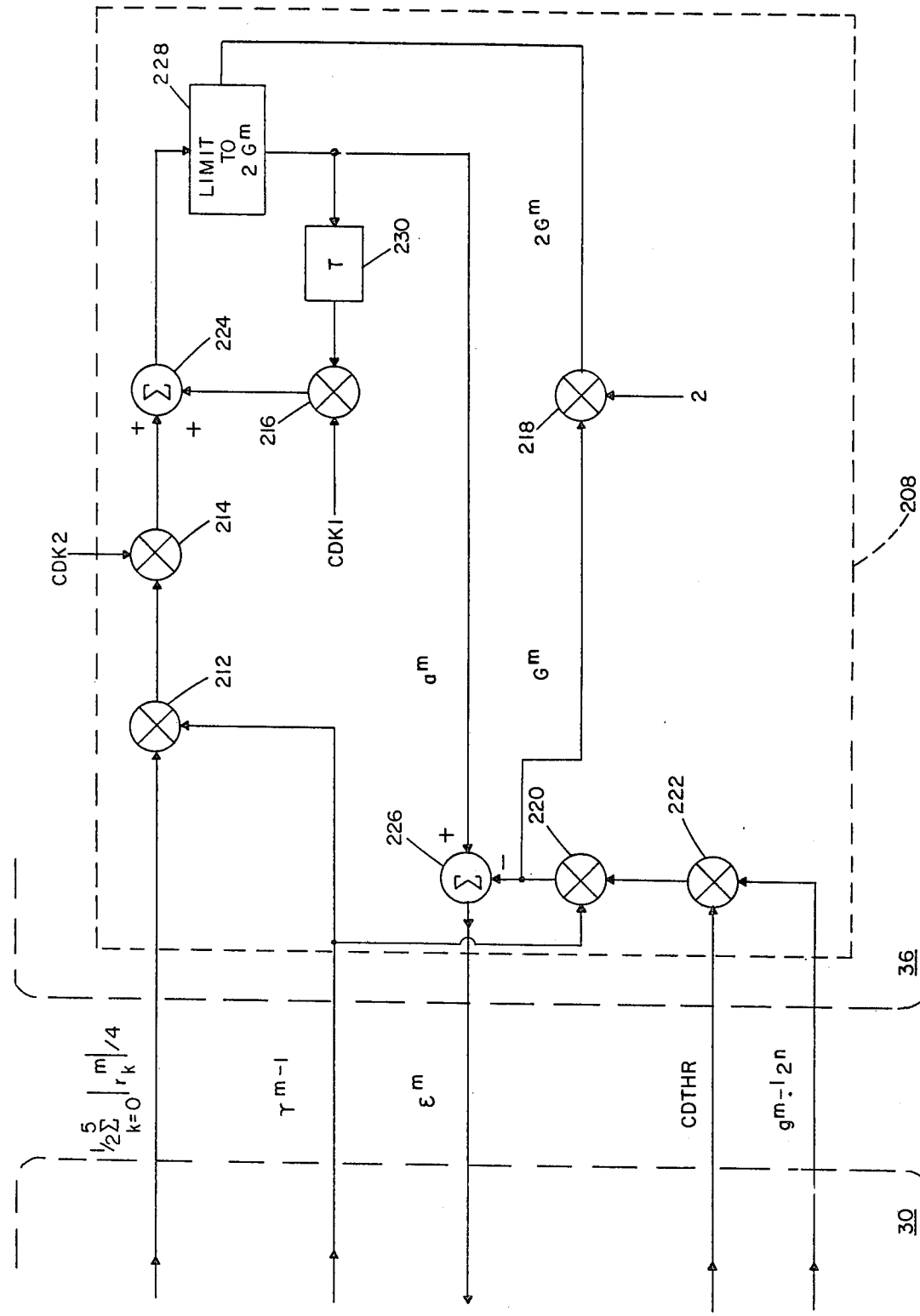
FIG. 6 is a block diagram of a procedure carried out by microprocessor circuitry in the receiver, to determine if carrier has been lost.

Carrier loss circuit 153 of FIG. 3 is implemented by the receiver, according to the digital filtering operation shown in FIG. 6.

Recursive, digital filter 208 consists of: multipliers 213, 214, 216, 218, 220, and 222; adders 224 and 226; limiter 228; and T delay 230. Its inputs, all sent by MPU 30 during the handshake operation are $$\left(\tfrac{1}{4}\sum_{k=0}^{5}|r_k^m|/4\right),$$

$\gamma^{m-1}$, $(g^{m-1}\cdot 2^n)$, and CDTHR.

Filter 208 outputs signal $\epsilon^m$ to MPU 30, once each symbol period, during the handshake operation. If $\delta^m$ is less than or equal to zero, MPU 30 raises a carrier loss signal.

Carrier loss signal $\epsilon^m$ provided as output by filter 208 is given by:

$$\epsilon^m = a^m - CDTHR\gamma^{m-1}(g^{m-1}\cdot 2^n)$$

where, $$a^m = CDK1\, a^{m-1} + CDK2\,\gamma^{m-1}\left(\tfrac{1}{4}\sum_{k=0}^{5}|r_k^{m-1}|/4\right).$$

Signal $a^m$, output from limiter 208, is a short term limited average of the signal amplitude. CDK2 and CDK1 determine the gain and time constants, where the time constant factor spans 8 symbols. They are stored in memory 70 as discussed below.

CDTHR is a constant fetched from memory 42. The value of n chosen by MPU 30 to compute $(g^{m-1}\cdot 2^n)$ is dependent upon the particular carrier-off threshold which has been selected. For carrier-off thresholds of −31, −38, −43, and −48 dBm, n equals 1, 0, −1, and −1 respectively.

If the amplitude of the received signal is high just before dropout, a potential problem is a lengthened time to detect carrier loss.

Choosing a relatively high value for CDK2 and including limiter 228 within filter 208 serves to alleviate this problem. Since $a^m$ then has a maximum value of $2G^m$, where:

$$G^m = CDTHR\gamma^{m-1}(g^{m-1}\cdot 2^n),$$

$\epsilon^m$ can have a maximum value of only $G^m$, and the time for $\epsilon^m$ to settle to zero following a dropout, where the received signal level has been relatively high, is reduced.

We now turn to a description, of one of the receiver's start-up procedures, carrier detect.

When the receiver is on line, but data transmission is absent, MPU 30 sets g to one of four fixed values, accessible in memory 42. The values for g are chosen such that, on one hand, a received signal having an amplitude of up to 6 dB greater than typical will not cause A/D converter 64 to latch up, and, on the other hand, a signal at the chosen carrier-on threshold will not be lost due to poor analog-to-digital resolution.

Figure 7:
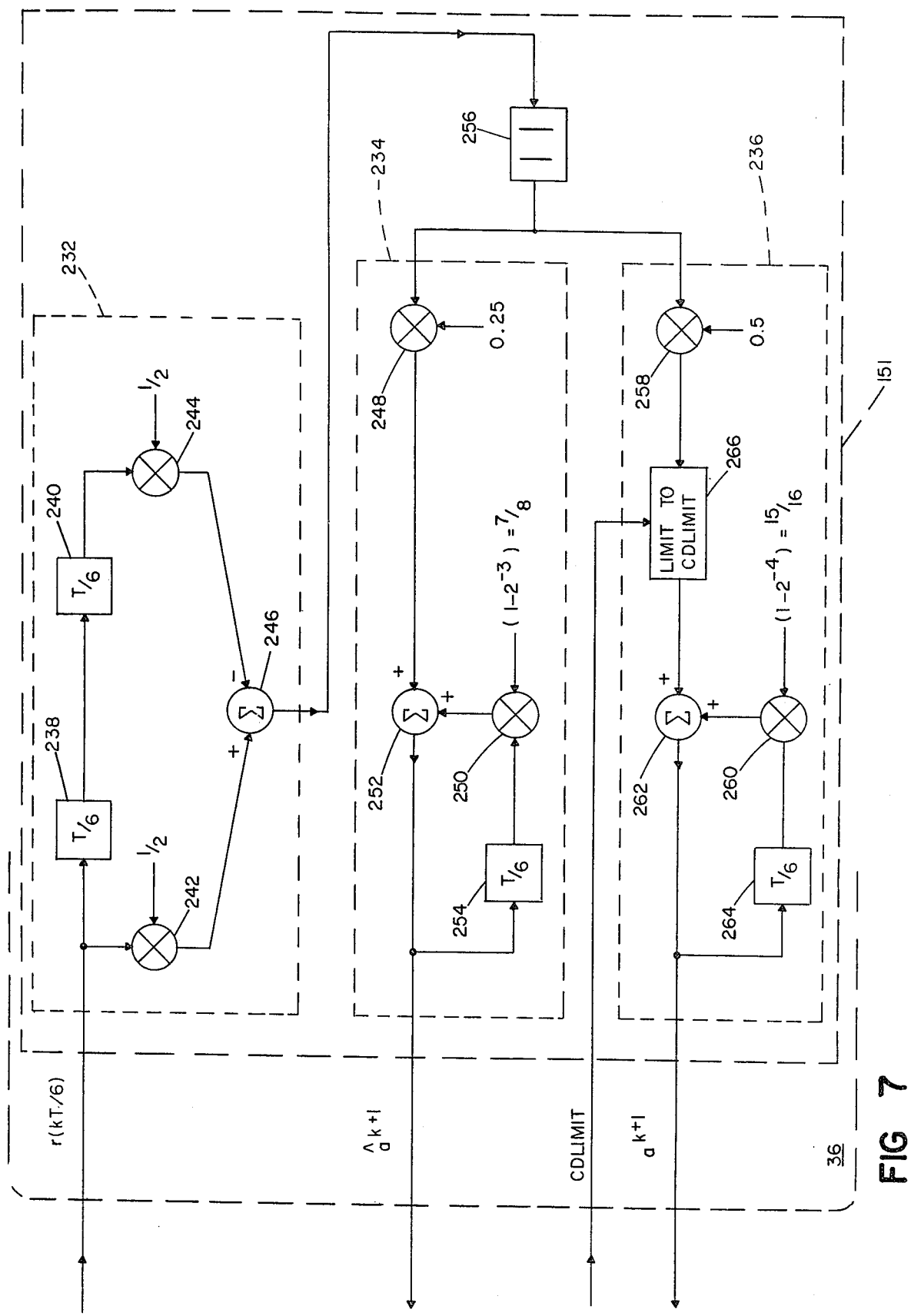
FIG. 7 is a block diagram of a procedure carried out by microprocessor circuitry in the receiver, to determine if carrier is incoming.

The strength of the received signals is continuously monitored by carrier detect circuit 151 of FIG. 3, shown in more detail in FIG. 7. The algorithms shown in FIG. 7. carried out totally by MPU 30, independent of SPE 36.

Carrier detect circuit 151 is made up of nonrecursive, digital filter 232 and recursive, digital filters 234 and 236.

MPU 30 receives signals r(kT/6), from A/D converter 64, and enters them into filter 232, consisting of T/6 delays 238 and 240, multipliers 242 and 244, and adder 246. Filter 232, having an amplitude shape of $|\sin(\pi f/3600)|$, removes any DC offset and supresses, by 6 dB or more, out-of-band signal or noise, below 600 Hz and above 3000 Hz. Its output, $0.5(r(kT/6)-r(kT/6-T/3))$, is fed to absolute value element 256 whose output is input to parallel filters 234 and 236.

Filter 235, made up of multipliers 248 and 250, adder 252, and T/6 delay 254, has output $\hat{a}^{k+1}$, a straight average of the incoming signal amplitude, given by:

$$\hat{a}^{k+1} = \hat{a}^k(1-2^{-3}) + 0.125|r(kT/6)-r(kT/6-T/3)|,$$

where $2^{-3}$ implies an 8 sample time constant.

Filter 236, made up of multipliers 258 and 260, adder 262, T/6 delay 264, limiter 266, and absolute value element 268, has an output of $a^{k+1}$, given by:

$$a^{k+1} = a^k(1-2^{-4}) + \min(0.125|r(kT/6)-r(kT/6-T/3)|, CDLIMIT)$$

where $2^{-4}$ implies a 16 sample time constant and CDLIMIT is one of four different numbers stored in memory 42. The value which MPU 30 uses for CDLIMIT depends upon the particular carrier-on threshold which has been selected. Use of limiter 268 in filter 236 desensitizes carrier detect circuit 151 against impulse noise and also reduces the large difference between maximum and minimum carrier detect time which would exist in its absence.

Each sample period, MPU 30 checks $a^{k+1}$. If it exceeds the carrier-on threshold which has been selected, MPU 30 raises a carrier detect condition and uses $\hat{a}^{k+1}$ as an index for 32-byte gain table, contained in memory 52, to select an initial value for gain factor $g^{m+1}$. MPU 30 also sets gain factor $\gamma$ to an initial value, chosen to be a value halfway between its upper and lower limits, KU and KL. During the remainder of start-up procedures, g and $\gamma$ are frozen at these initial values, their first updating being made upon reaching data mode.

Other embodiments are within the following claims.

I claim:

1. Modem receiver apparatus having means for receiving, demodulating, and decoding a modulated carrier signal encoded to represent digital bits, wherein said apparatus includes programmable digital microprocessor circuitry for arithmetic manipulation of digital values to generate a sequence of received signal values for demodulation in said receiver apparatus, based upon the received modulated carrier signal, wherein said apparatus comprises a digitally controlled gain element for imposing on said received modulated carrier signal a gain corresponding to gain control signals g, said element being connected to said microprocessor circuitry to receive therefrom said gain control signals g, an analog-to-digital converter, responsive to said digitally controlled gain element to receive a gain-affected modulated carrier signal therefrom, said converter being connected to said microprocessor circuitry to provide thereto digital samples of said gain-affected received modulated carrier signal for generating said sequence of received signal values for demodulation in said receiver apparatus, and gain control means in said microprocessor circuitry for storing and executing program instructions to estimate a gain control average level of said samples based upon said gain-affected modulated carrier signal, comparing said average level with a desired level to compute a value representative of the relationship between said average and desired levels, and generating said control signals g based upon said relationship and wherein said, microprocessor circuitry further comprises carrier detect means for storing a gain value corresponding to the current gain provided by said element, computing a carrier detect average level of said samples, and using said stored gain and said carrier detect average to raise a carrier detect signal when said carrier detect average exceeds a carrier detect threshold.

2. The apparatus of claim 1 wherein said carrier detect average differs from said gain control average.

3. The apparatus of claim 1 wherein said carrier detect means includes means for limiting the magnitude of said samples prior to computation of said carrier detect average.

4. Modem receiver apparatus having means for receiving, demodulating, and decoding a modulated carrier signal encoded to represent digital bits, wherein said apparatus includes programmable digital microprocessor circuitry for arithmetic manipulation of digital values to generate a sequence of received signal values for demodulation in said receiver apparatus, based upon the received modulated carrier signal, wherein said apparatus comprises a digitally controlled gain element for imposing on said received modulated carrier signal a gain corresponding to gain control signals g, said elements being connected to said microprocessor circuitry to receive therefrom said gain control signals g, an analog-to-digital converter, responsive to said digitally controlled gain element to receive a gain-affected modulated carrier signal therefrom, said converter being connected to said microprocessor circuitry to provide thereto digital samples of said gain-affected received modulated carrier signal for generating said sequence of received signal values for demodulation in said receiver apparatus, and gain control means in said microprocessor circuitry for storing and executing program instructions to estimate a gain control average level of said samples based upon said gain-affected modulated carrier signal, comparing said average level with a desired level to compute a value representative of the relationship between said average and desired levels, and generating said control signals g based upon said relationship, and wherein said microprocessor circuitry further comprises carrier loss means for storing a gain value corresponding to the present gain provided by said element, computing a carrier loss average level of said samples, and using said stored gain and carrier loss average to provide a carrier loss signal to indicate that the carrier is lost when said carrier loss average falls below a carrier loss threshold.

5. The apparatus of claim 4 wherein said carrier loss means includes means for limiting said carrier loss average.

6. The apparatus of claim 5 wherein said limiting value is a function of said carrier loss threshold.

7. The apparatus of claim 3 wherein said limiting value is a function of said carrier detect threshold.

8. Modem receiver apparatus having means for receiving, demodulating, and decoding a modulated carrier signal encoded to represent digital bits, wherein said apparatus includes programmable digital microprocessor circuitry for arithmetic manipulation of digital values to generate a sequence of received signal values for demodulation in said receiver apparatus, based upon the received modulated carrier signal, wherein said apparatus comprises a digitally controlled gain element for imposing on said received modulated carrier signal a gain corresponding to gain control signals g, said element being connected to said microprocessor circuitry to receive therefrom said gain control signals g, an analog-to-digital converter, responsive to said digitally controlled gain element to receive a gain-affected modulated carier signal therefrom, said converter being connected to said microprocessor circuitry to provide thereto digital samples of said gain-affected received modulated carrier signal for generating said sequence of received signal values for demodulation in said receiver apparatus, and gain control means in said microprocessor circuitry for storing and executing program instructions to estimate a gain control average level of said samples based upon said gain-affected modulated carrier signal, comparing said average level with a desired level to compute a value representative of the relationship between said average and desired levels, and generating said control signals g based upon said relationship, and wherein said gain control means further comprises gain intialization means for estimating said average and multiplying the existing control signal g by the ratio of said desired level to said average, to thereby initialize g.

9. The apparatus of claim 8 wherein after said initialization of g said comparing of said average level to said desired level is by subtraction.

10. The apparatus of claim 1 wherein said gain control means includes means for computing said carrier detect average prior to raising said carrier detect signal.

* * * * *

UNITED STATES PATENT OFFICE
CERTIFICATE OF CORRECTION

Patent No. 4,439,864                  Dated March 27, 1984

Inventor(s) Shahid U. H. Qureshi

It is certified that error appears in the above-identified patent and that said Letters Patent are hereby corrected as shown below:

Under "References Cited" "Qureshi" is misspelled.

In the abstract, line 7, after "modulated" delete --p. 2--.

Column 2, line 20, "35" should be --34--.

Column 4, line 44 "$\gamma^m = \gamma^{m-1}$" should be --$\hat{\gamma}^m = \gamma^{m-1}$--.

Column 5, line 27, "$\delta^m$" should be --$\varepsilon^m$--.

Column 6, line 26, "235" should be --234--.

Signed and Sealed this

Sixteenth Day of October 1984

[SEAL]

*Attest:*

*Attesting Officer*

GERALD J. MOSSINGHOFF

*Commissioner of Patents and Trademarks*